United States Patent [19]

Dimitrijevic et al.

[11] Patent Number: 4,932,075
[45] Date of Patent: Jun. 5, 1990

[54] HIGH SPEED WIDE RANGE VARIABLE RATE POWER DETECTOR

[75] Inventors: Peter Dimitrijevic, Redondo Beach; Mark Skidmore, Long Beach; Theodore S. Fishkin, Lawndale, all of Calif.

[73] Assignee: Hughes Aircraft Company, Los Angeles, Calif.

[21] Appl. No.: 881,985

[22] Filed: Jul. 3, 1986

[51] Int. Cl.$^5$ ............................................. H04B 17/00
[52] U.S. Cl. ..................................... 455/226; 455/67; 324/613
[58] Field of Search ............... 455/226, 287, 291, 292, 455/294, 67, 234, 241, 245, 253; 324/57 N; 328/151; 307/151, 362; 343/703

[56] References Cited

U.S. PATENT DOCUMENTS

| 4,363,138 | 12/1982 | Franklin | 455/226 |
| 4,378,605 | 3/1983 | Baumann, Jr. et al. | 455/226 |
| 4,531,235 | 7/1985 | Brusen | 455/226 |
| 4,580,287 | 4/1986 | Richards, Jr. | 455/226 |
| 4,619,002 | 10/1986 | Thro | 455/226 |
| 4,661,996 | 4/1987 | Scandurra | 455/226 |
| 4,691,381 | 9/1987 | Bollard | 455/226 |
| 4,723,303 | 2/1988 | Koch | 455/226 |

Primary Examiner—Robert L. Griffin
Assistant Examiner—Curtis Kuntz
Attorney, Agent, or Firm—Steven M. Mitchell; Wanda K. Denson-Low

[57] ABSTRACT

A high speed wide dynamic range variable rate power detector which provides an output signal linearly proportional to the input power level. The invention operates essentially independently of the system computer and provides a gain measurement system effective in the testing of an antenna in a frequency hopping mode. The illustrative embodiment includes a first subcircuit for down converting an RF input signal to a fixed intermediate frequency signal; a second subcircuit for converting the intermediate frequency signal to a DC signal; a third subcircuit for varying the rate of conversion of intermediate frequency signals to DC signals and a fourth subcircuit for providing an output signal which is proportional to the log of the DC signal.

2 Claims, 4 Drawing Sheets

HIGH SPEED WIDE RANGE VARIABLE RATE POWER DETECTOR

BACKGROUND OF THE INVENTION

1. Field of the Invention

The present invention relates to test and measurement systems. More specifically, the present invention relates to high speed IF (intermediate frequency) power detectors.

While the present invention is described herein with reference to a preferred embodiment in an illustrative application, it is to be understood that the invention is not limited thereto. Those having ordinary skill in the art and access to the teachings of the present invention will recognize additional modifications, embodiments and applications within the scope thereof.

2. Description of the Related Art

The high cost associated with the manufacture and launch of satellite systems and the subsequent inaccessibility thereof makes it imperative that the satellite be designed in all respects to provide reliable performance throughout its useful life. As a key component of the system, the antenna and its design must be proven to be satisfactory prior to launch. Accordingly, antenna test and measurement systems are used to fully exercise the antennas in many modes of operation. Some systems test the far field performance of the antenna. These systems are typically open loop. Other systems test the near field performance of antenna. The near field systems are typically closed loop in that the activation of the transmit antenna and the collection of data from the antenna under test are under the control of a single system controller. The far field tests are typically concerned with signal strength or amplitude. The near field tests typically require amplitude as well as phase information to extract the far field radiation pattern.

The tests are typically quite extensive. Transmit and/or receive beam characteristics are often tested as a function of many variables, parameters and operating conditions. The gain, for example, may be measured as a function of frequency, azimuth, elevation, distance and/or time. Numerous combinations and permutations of variables may be used as part of a single testing program.

In addition, where the antenna is of the phased array variety having a plurality of sensing and/or receiving elements (feeds), beam forming networks, input and output channels and/or input and output ports, the test may involve switching various combinations of feeds through various combinations of channels and ports. It is often desirable to run such tests using any of several signal polarization states.

It is not difficult then to imagine how in some tests, as many as ten million gain measurements alone may be required. This is typically a time consuming process requiring specialized equipment and personnel skilled in the field. As such, the testing of the antenna adds significantly to the development and manufacturing cost of the overall system. There is therefore a generally recognized need in the art to minimize the time required to completely test such antennas.

There is a countervailing need to perform more and more tests as antennas become more capable and complex. For example, while the antenna scans in azimuth, it was typically necessary to make a gain measurement at certain ports, channels and feeds at a specific frequency. However, there has now been recognized a need to make such measurements while simultaneously hopping in frequency.

Conventional measurement systems have had difficulty meeting the demanding requirements of this application. The operating speed of conventional systems has been a primary limitation. As discussed more fully below, limitations on the speed of conventional systems may result from the scheme used to detect and measure input power or gain and/or the capability of the system to switch from one set of ports to another.

Many prior art systems also require a computer to control the complex system through the testing program. In such systems, the computer is required to set up and energize the antennas, switch channels in and out of the testing apparatus, make and process the desired measurements, and store the resulting data. It is generally desirable to free the computer from such tasks. This would allow for additional increases in system speed and/or operating capability.

To make the above-noted antenna gain measurements, conventional systems typically use one of the following detection techniques: analog non-linear circuits such as square law devices and half-wave and full-wave rectifiers, analog-to-digital conversion with subsequent digital processing to accomplish detection, analog synchronous detectors, detector log video amplifiers, thermal (caloric) conversion circuits, and circuits employing conventional analog computational functions such as true RMS to DC converters and DC log amplifiers.

Square law devices and half-wave and full-wave rectifier circuits process signals in a non-linear manner such that a DC term, related to the input signal level, is generated. However, for the half-wave and full-wave circuits, the output is not proportional to the input power level, and realizable square law devices are proportional only over a small dynamic range. Most non-linear approaches require some form of post-detection processing such as a look-up table where the detector output is used by the computer as an address to a memory input location where the value corresponding to the true (error corrected) input power level is stored. This approach is undesirable in that it requires computer time. In addition, these approaches require post detection filtering to prevent the AC input signal and its products, generated as a consequence of the non-linear processing, from affecting the desired output. The filter bandwidth must be small relative to the AC input frequency; this degrades the settling time performance.

Digital signal processing techniques may be used to compute the power of a waveform by sampling and quantizing the AC signal (usually a frequency translated version of the input signal to be measured) and computing the power based on the value of the digital samples. To minimize errors due to aliasing and quantizing, high speed, high resolution analog to digital (A/D) converters are required. The actual computation may be accomplished within the system computer. This is generally undesirable since the additional computational effort will significantly degrade system speed or require additional dedicated digital processing hardware further increasing the complexity of the system.

Synchronous detectors using video (baseband or DC) log conversion are exemplified by conventional network analyzers. These systems typically require the use of a phase locked loop. To achieve acceptable phase stability in the presence of noise, the loop filter would have to have an undesirably long time constant. This would increase the time to acquire lock on the input signal after a change in the frequency of the input signal and decreases system response time. Thus, such systems are typically too slow for frequency hopping applications.

In addition, the synchronous detection schemes typically employ a closed loop which must be stable over a wide input dynamic range. Wide variations in input signal level impact on the effective bandwidth of the system. This in turn adversely affects the noise performance of the system. To improve the noise performance of synchronous systems, limiters and AGC (automatic gain control) loops have been used.

Limiters clip the incoming AC signal and force it within the dynamic range of the system. AGC circuits scale the input signal down by a known amount bringing it within the dynamic range of the system. Both circuits increase system complexity. In addition, AGC circuits increase the settling time of the system.

Commercial detector log video amplifiers (DLVAs) operate without phase locked loops. The AC input signal is transformed into a DC output signal by multiple stages of limiting amplifiers. However, DLVA transfer functions exhibit discontinuities between stages. The discontinuities, ie., points of nonlinearity in the input-output response, adversely affect system accuracy and performance. The nonlinearities could be reduced with a computer look-up table, but this approach would be undesirable for the reasons mentioned above.

Since the nonlinearities are inversely proportional to the number of stages used, another solution would be to use additional stages. However, to achieve the degree of accuracy and linearity required in a frequency hopping antenna test and measurement system over a sufficiently wide dynamic range would require an impractically large number of cascaded stages.

Thermal techniques calculate power by converting the incoming waveform into thermal energy and measuring the temperature rise of the medium. Although accurate, this method is extremely slow and hence totally unsuitable for the present application.

Finally, conventional analog RMS and log converters use an analog log-integrate-antilog algorithm in operation. The major limitation of these systems is in settling time performance. The poor settling time performance is due to the relatively large time constant of the averaging integrator. This time constant must be sufficiently large (compared to the AC input frequency) to prevent the AC input signal from reaching the converter output. This ripple component would reduce the conversion accuracy and degrade the stability of the DC output to be measured. These systems are generally inadequate for the present application.

The related art thus demonstrates a need for a practical, stable, accurate, and flexible gain measurement system effective in the testing of an antenna in a frequency hopping mode. Such a system should be independent of the system computer and capable of quickly and easily switching between numerous input ports.

SUMMARY OF THE INVENTION

The need illustrated by the related art is substantially addressed by the high speed wide range variable rate power detector of the present invention. The power detector disclosed and claimed herein, includes a first subcircuit for down converting an RF input signal to an intermediate frequency signal. A second subcircuit converts the intermediate frequency signal to a DC signal. A third subcircuit varies the rate of conversion of intermediate frequency signals to DC signals. The third subcircuit allows for an increase in speed of operation when accuracy is not the highest priority. A fourth subcircuit is included to provide an output signal which is proportional to the log of the DC signal. The invention thus provides an output signal which is proportional to the power associated with the input signal. The present invention operates essentially independently of the system computer and it provides an antenna gain measurement which is effective in the conventional testing modes as well as the heretofore unattainable frequency hopping mode.

DESCRIPTION OF THE INVENTION

As discussed more fully below and illustrated in the drawings, the present invention provides a high speed wide range antenna gain measurement system. As disclosed and claimed in the application of T. Fishkin et al for an "Improved Test and Measurement System for Antennas", Ser. No. 06/819,964, now U.S. Pat. No. 4,754,496 the antenna test system for which the present invention was developed has response time that is initially improved relative to conventional systems by the elimination of the requirement of phase locking on the incoming signal. Instead, the incoming microwave signal is mixed with an appropriate frequency reference signal to generate a power detector RF input signal of fixed frequency regardless of the frequency under test.

At the power detector of the present invention, the RF input signal is down converted to an IF signal. The IF signal is filtered and input to a baseband processor. The baseband processor converts the IF signal to a DC signal. The present invention includes a quench circuit that allows for selective control of the rate of this conversion, thereby allowing for a faster conversion where accuracy is not the highest priority. This allows for a further speed improvement over AC to DC converters of conventional design. Finally, to accommodate inputs of wide dynamic range, the DC signal is passed through a logarithmic amplifier.

As will be evident from the following description taken in conjunction with the drawings of FIGS. 1-4, numerous subcircuits are employed in the illustrative preferred embodiments to filter, clean and isolate the processed signal to further enhance the accuracy of the system.

Figure 1:
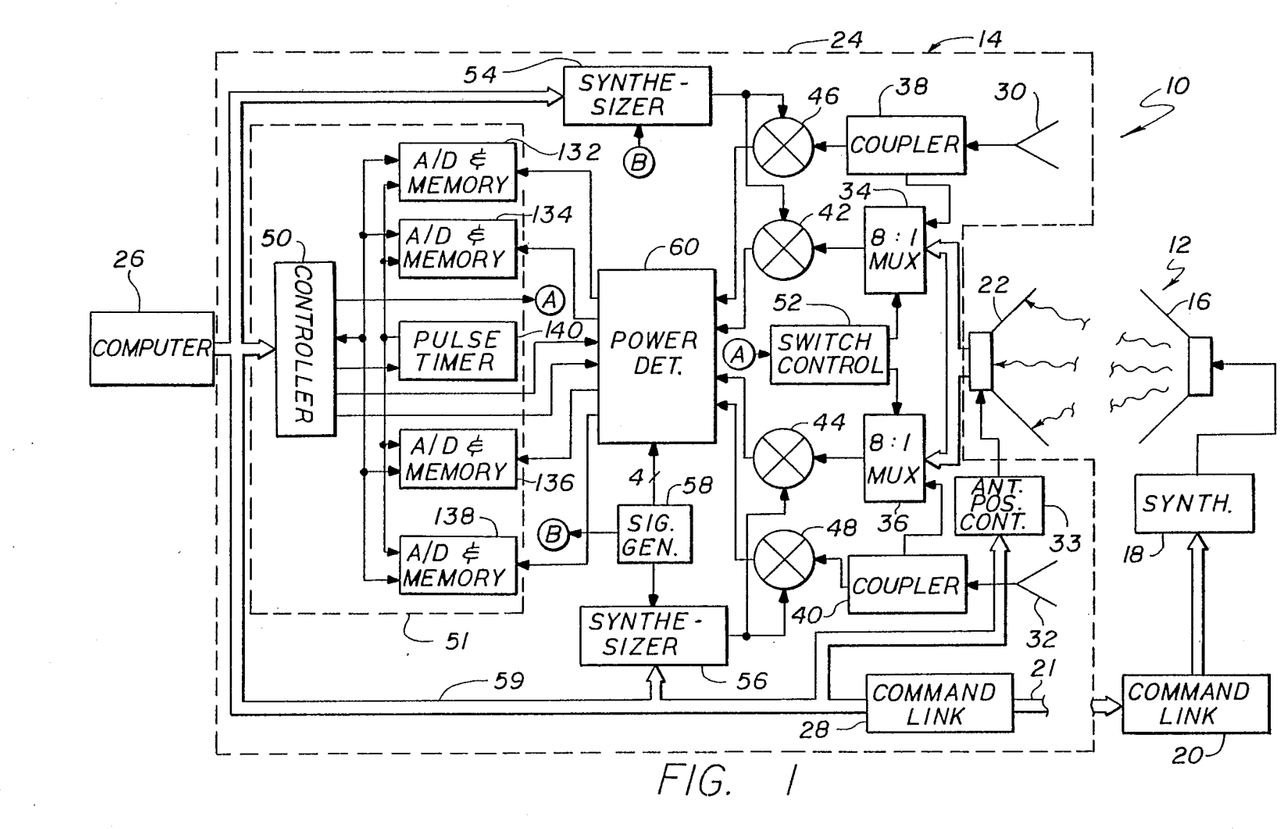
FIG. 1 is a diagramatic representation of an antenna test range incorporating the present invention.

FIG. 1 shows an illustrative antenna range test and measurement system 10 having a transmitter section 12 and a receiver section 14. The transmitter section 12 includes an antenna 16. The antenna 16 is a source of microwave or radio frequency (RF) energy by which the receive antenna (discussed below) is tested. Any conventional antenna may be used as the source antenna 16. The preferred embodiment contemplates the use of an antenna with dual reflectors one for each of the bands used for the test. Thus, for example, one reflector would generate a 4 Ghz signal while the other would radiate at 6 Ghz. Not shown are associated feed horns and other hardware which those of ordinary skill in the art will recognize as incidental to the antenna 16. It is understood that the size, shape, configuration and performance parameters of the source antenna 16 would be optimized to fit the test requirements.

The antenna 16 receives signals from a frequency synthesizer 18. The frequency synthesizer 18 is an off-the-shelf item and is available, for example, from Hewlett Packard as a model 8673B. The frequency synthesizer 18 is driven by the command link interface 20 to provide microwave signals of various frequencies, depending upon the particular wavelength being tested. The command link interface may provide other signals to the transmitter section 12 to cause the generation of a desired source antenna characteristic. The command link interface is also an off-the-shelf item and is available, for example, from Hewlett Packard.

The receiver section 14 includes the antenna under test 22, a test and measurement system 24 incorporating the present invention, and a computer 26. The test and measurement system 24 includes a second command link interface 28 of substantially similar manufacture and design. The receiver command link interface 28 of the preferred embodiment communicates with the transmitter command link interface 20 via modems (not shown) and a telephone link 21, under control of a central computer 26. Thus, the computer 26 controls the test program by selectively commanding the activation of the source antenna 16.

The antenna under test 22 receives signals over free space from the source antenna 16 and provides a microwave output signal which may vary in amplitude, phase and frequency during the course of the test program. The microwave output of the antenna provides the input signal to the test and measurement system 24. The test and measurement system 24 includes monitor antennas 30 and 32 which are mounted in proximity to the antenna 22 under test. The monitor antennas are adapted to receive signals from the source antenna 16 and provide an output which is used as a reference or control signal during the test program. The monitor antennas 30 and 32 are standard gain horns. In the illustrative embodiment, one antenna 30 provides a 6 Ghz power monitor while the second antenna 32 provides a 4 Ghz power monitor.

The orientation of the antenna under test is controlled by an antenna position control circuit 33 under command of the central computer 26. The antenna position control circuit 33 is a conventional servo-control circuit with associated motors. It includes a conventional shaft encoder (not shown) which is read by the computer during the test program to ascertain and record the orientation of the antenna 22. The output of the antenna 22 provides input signals for the balance of the receiver section 14.

Multiplexers 34 and 36 selectively switch signals from the antenna 22 and signals from the monitor antennas 30 and 32 (via off-the-shelf power couplers 38 and 40) to first and second mixers 42 and 44. In the illustrative embodiment, 14 output ports (not shown) from the antenna 22 are selectively coupled to the mixers 42 and 44 by 8:1 multiplexers 34 and 36. Thus, the first seven ports of the antenna 22 along with the output from the first monitor antenna 30 provide the eight inputs to the first multiplexer 34. Similarly, the eighth through fourteenth ports of the antenna 22 along with the output from the second monitor antenna 32 are provided as the eight inputs to the second multiplexer 36.

The multiplexers are standard pin diode switch muxes sold by Microdynamics for example. The power couplers 38 and 40 are sold off-the-shelf as models 3043B and 3044B made by Narda Microwave. The second output from each of the power couplers 38 and 40 are provided as first inputs to third and fourth mixers 46 and 48 respectively. The mixers 42–48 are standard double balanced mixers which may be acquired off-the-shelf from RHG Electronics as model DMB2-18 mixers.

As conventional phased array antennas couple several feedhorns through each port, the multiplexers 34 and 36 allow the computer 26 to look at various combinations of antenna feeds and reference signals through the system controller 50 and the multiplexer control circuit 52. As discussed more fully below, the controller 50 is part of a Hewlett Packard multiprogrammer 51.

The mixers 42 and 46 receive a reference frequency from a first frequency synthesizer 54, while mixers 44 and 48 receive a reference frequency from a second frequency synthesizer 56. Each synthesizer multiplies a fixed reference frequency from a signal generator 58 to output a frequency on command from the computer 26 via the general purpose instrumentation bus (GPIB) 59. The synthesizers 54 and 56 are commercially available as from Hewlett Packard for example as model 8673B. The GPIB 59 is an IEEE 488 or equivalent.) In the illustrative preferred embodiment, the synthesizers 54 and 56 generate frequencies which when mixed with the input signals at the mixers 42–48 cause the mixers to output a set of signals of a predetermined fixed frequency of 10.020 Mhz. The output of each mixer is provided as one of the four channels of input to the power detector 60 of the present invention.

Figure 2:
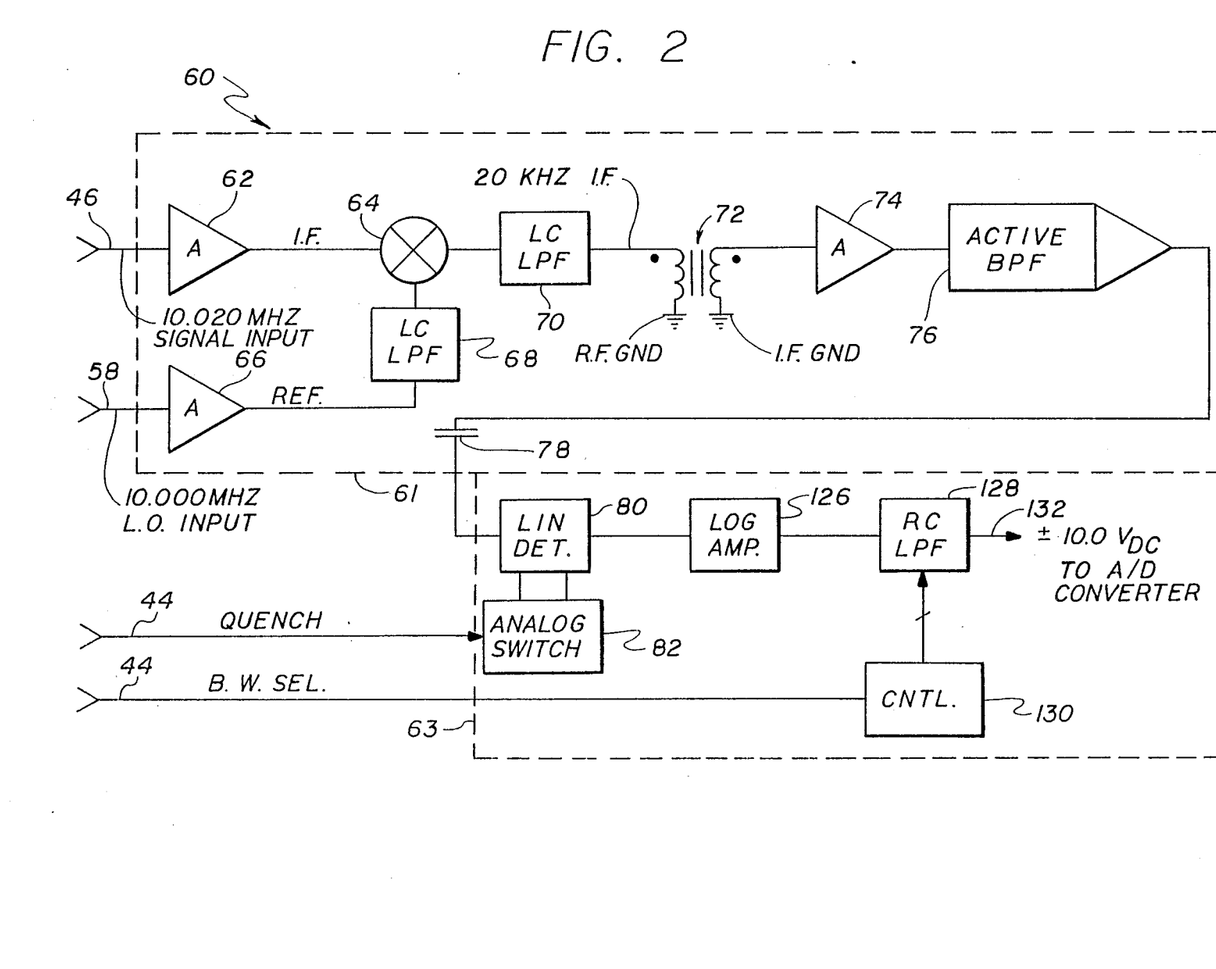
FIG. 2 is a block diagram showing the power detector of the antenna gain measurement subsystem of the present invention.

The power detector 60 has four identical processing channels one of which is shown in FIG. 2. Each channel includes an IF down converter section 61 and a baseband processor section 63. The power detector 60 receives inputs from the four mixers 42–48, four 10 Mhz reference frequencies from the signal generator 58 (one of which is shown), and a quench control signal from the controller 50. The detector 60 provides a DC output signal on each of its output channels to the multiprogrammer 51.

The IF down converter section 61 is a wide dynamic range down converter which converts the 10.02 Mhz RF input signal to a 20 Khz IF signal for convenient signal processing. It includes a pre-mixer gain stage shown as a single amplifier 62. In the illustrative embodiment, the gain is provided by two off-the-shelf amplifiers (not shown) which may be purchased from Watkins-Johnson Company as models CA 75-3 and CA 88. The amplifiers should provide enough gain to offset mixer and pad losses and still have enough gain to produce a usable output down to and including the bottom of the input dynamic range. The amplifiers chosen should provide high gain, low noise, and a high compression point to insure good linearity up to and including the top of the input dynamic range.

The amplified 10.02 Mhz input signal is mixed with a 10 Mhz reference signal from the signal generator 58 at a high level mixer 64. The mixer was chosen to allow a high IF gain while still preserving linearity at the top of the dynamic range. The mixer chosen for the illustrative embodiment was a Watkins-Johnson MT9. The mixer has resistive pads (not shown) at each port to improve VSWR (voltage standing wave ratios) and absorb unwanted mixer products. If the unwanted mixer products were allowed to reflect back into the mixer 64, they could degrade the intermodulation performance. Amplifier 66 on the reference input to the mixer 64 is composed of off-the-shelf devices, Avantek Inc. models UTO-161. The amplified reference signal is filtered by a low pass filter 68 to reject harmonics. The output of the mixer is a fixed IF frequency (20 Khz in the illustrative embodiment) regardless of the frequency at the antenna under test. This allows for simplified optimization of the power detector 60.

A second low pass filter 70 rejects higher order products that will be present in the IF output of the mixer 64. Spurs close in frequency to the IF frequency of 20 Khz are filtered later by the active filter discussed below.

The filtered output signal is passed to a wideband video transformer 72 (a North-Hills Electronics part number 0904LA) which performs a low noise voltage step up function to drive a low noise operational amplifier gain stage 74. The transformer impedance step up ratio was chosen to provide a drive impedance closer to the source impedance required for optimum noise performance of the amplifier 74, while preserving the bandwidth and response flatness at the IF frequency (20 Khz). In addition to low noise voltage gain and impedance matching functions, the transformer 72 provides noise isolation. It decouples the multipoint RF grounds on one side of the transformer 72 from the single point grounds on the other. In the illustrative embodiment, operational amplifier 74 is an OP-37 sold by Precision Monolithics Inc.

The transformed amplified IF signal is input to an active bandpass filter 76. The filter 76 is a noise determining filter which rejects lower intermodulation products. The bandwidth of the filter 76 has to be narrow enough to reject mixer generated harmonics of the 20 Khz IF signal but wide enough to prevent long term synthesizer drifts from degrading system measurement accuracy. In the illustrative embodiment the specifications on the filter 76 (a product of Frequency Devices Inc.) are shown in Table I below.

TABLE I

| TRANSMISSION CHARACTERISTICS | |
| --- | --- |
| Insertion gain | 0 dB ± 0.5 dB |
| (measured from input reference to the frequency of maximum transmission in 18.8 Khz–21.2 Khz band) | |
| Transmission variation | 0.01 dB max. |
| (insertion loss plus attenuation) over 21–38 degrees centigrade at 18.828 Khz, 20.000 Khz, 21.172 Khz) | |
| Passband ripple | 0.01 dB max. |
| (18.828 Khz to 21.172) | |
| Attenuation | |
| DC to 180 Hz | 80 dB min. |
| 16.466 Khz | 3 dB min. |
| 18.828 Khz to 21.172 Khz | 0.01 dB max. |
| 24.210 Khz | 3 dB min. |
| 38.828 Khz | 25 dB min. |
| 58.828 Khz to 10 Mhz | 25 dB min. |
| INPUT CHARACTERISTICS | |
| Capacitance | 100 pf max. |
| Impedance | 2000 ohms min. |
| Voltage | ±14.2 V peak at V supply = ±16.5 Vdc |
| OUTPUT CHARACTERISTICS | |
| Slew rate | 1.88 V/usec |

TABLE I-continued

| | |
| --- | --- |
| Impedance | 10 ohms max. min. |
| Voltage swing | ±14.2 V peak at V supply = ±16.5 Vdc min. into 2.5K ohms |
| Current | 5.6 mA peak min. into 2.5K ohms |
| DC offset | 0.00 ± 40 mV dc (includes drift over temp range max. T = 21 to 38 degreees centigrade) |
| Noise voltage 100 Hz to 15.7 Mhz | 94 uV rms max. |
| POWER SUPPLY | |
| Operating voltage | ±18 Vdc max. |
| Supply currnet | not critical |
| MECHANICAL CHARACTERISTICS | |
| Operating temperature range | 21–38 deg. cent. |
| (The operating parameters apply over the full specified temperature range unless otherwise noted. All values of attentuation are relative to the attenuation at the frequency of maximum transmission.) | |

The IF frequency of the illustrative embodiment was chosen to be 20 Khz to allow for input of a signal to the baseband processor 63 which has a narrow 2 Khz noise bandwidth. The chosen noise bandwidth insures the accuracy and speed of response of the baseband processor to be within the performance specifications of the illustrative embodiment. The filter 76 is AC coupled to the baseband processor 63 by a capacitor 78. The capacitor 78 serves to prevent DC offsets generated by the op-amp filter cascade from affecting system accuracy.

The baseband processor 63 includes a linear detector 80 which converts the 20 Khz IF signal to a DC signal. The linear detector is a true RMS converter based on the log-integrate-antilog method of RMS conversion. In the preferred embodiment, the detector 80 is a commercial hybrid function module model #442L made by Analog Devices. It is understood by those of ordinary skill in the art that other schemes for converting the IF signal to DC may be employed without departing from the scope of the present invention. The quench circuit 82 is included to vary the settling time for the conversion of IF to DC.

Figure 3:
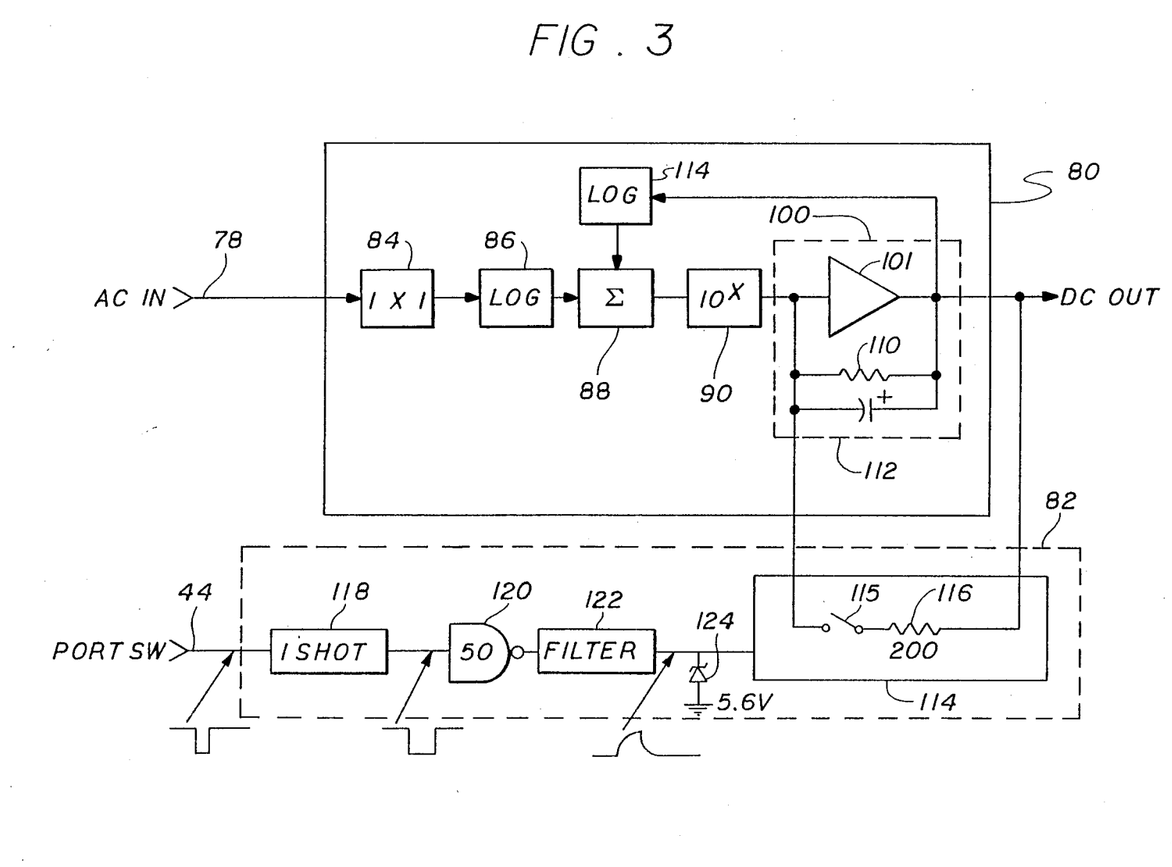
FIG. 3 is a block diagram showing the linear detector and associated quench subcircuit of the power detector of the present invention.

The linear detector 80 and the quench circuit 82 are shown in greater detail in the block diagram of FIG. 3. It should be understood that inasmuch as the linear detector 80 is a proprietary commercial item, the details of its construction were not available to the applicants. The diagramatic representation of the linear detector of FIG. 3 different input step sizes depending upon whether the transition is up or down. That is, the nominal value for the resistor 116 will be optimal for a specific step size and direction.

The output of the linear detector 80 is a positive DC voltage proportional to the RMS value of the composite signal present at its input. This positive going DC output voltage is fed to the input of a precision DC log amp hybrid 126 (model AD755N, made by Analog Devices).

The log amp 126 provides a DC output which is proportional to the log of the input DC signal. This allows for the detector 60 to handle signals of wide dynamic range and still provide an output that is within the specifications of the A/D converters discussed below. The transfer function of this log amp ideally follows the function:

$$V_{out} = -K \log_{10}[(I_{in} - I_{os})/I_{ref}]$$

where:
Vout=the output voltage of the log amp 126;
K=the transfer function scale factor (post log function gain);
Iin=input signal current;
Ios=input bias current
Iref=internal constant current reference.

To enhance the measurement accuracy of the baseband processor 63, the linear detector 80 and the log amp 126 are mounted on a heated baseplate (not shown). The heat stabilizes the temperature environment and minimizes thermal drifts.

The output of the log amp 126 is input to the low pass filter 128. The filter 128 serves to remove much of the residual noise. A control circuit 130 allows for the selection of a wider bandwidth during intervals when speed is of a greater concern than accuracy. The control circuit 130 operates under command of front panel switches (not was acquired by inference only. The manufacturer Analog Devices should be contacted for an accurate depiction of this device and for a description of its operation. For the present invention, it is important that the linear detector 80 accurately convert the incoming IF signal to a DC signal and that the quench circuit 82 cut the settling time of the integrator 100 which includes an operational amplifier 101, a feedback resistor 110 and a feedback capacitor 112 to meet the speed requirements of the system.

The quench circuit 82 functions to reduce the settling time of the linear detector 80 to increase system automated measurement speed without degrading accuracy of measurement. The quench circuit 82 includes an off-the-shelf analog switch 114 (a DG 303A made by Siliconix Inc.). The switch 114 includes an internal switching element 115 and a resistor 116. The switch 114 is driven by a one shot 118, a set of drivers, one for each channel, 120 and an EMI filter 122. The output of the one shot 118 should be long enough to completely discharge the capacitor 112, but not so long as to reduce the time allowed for the output of the linear detector 80 to settle. The filter 122 serves to prevent any conducted electromagnetic interference on the line from degrading the sensitivity at the baseband processor 63.

The switch 115 closes upon the application of a high level TTL logic signal. While the switch 115 is closed, the output of the linear detector tracks the absolute value of the AC present at its input. RMS averaging does not take place. When the switch 115 opens, normal RMS conversion takes place.

The resistor 116 should be chosen to allow for the fast discharge of the capacitor 112, while at the same time maintaining enough gain for the output circuit of the linear detector 80 during the time the switch 115 is closed. This will serve to minimize the additional time required for the detector 80 to slew to the new value when normal operation resumes. The optimal value for this resistor will vary for shown) or the computer 26.

In the illustrative embodiment, output of the filter 128 is a +10 volt signal which is input to the analog to digital converters 132 to 138. One A/D converter is provided for each channel of the detector 60. The controller 50, A/D converters with associated memories 132-138, and pulse timer card 140 are all part of an off-the-shelf multiprogrammer made by Hewlett Packard. The computer 26 sequentially accesses the memories associated with the controller 50. Thus, with the controller 50 controlling the operation of the invention, the computer 26 is free to do other tasks until it reads data from the controller 50.

Figure 4:
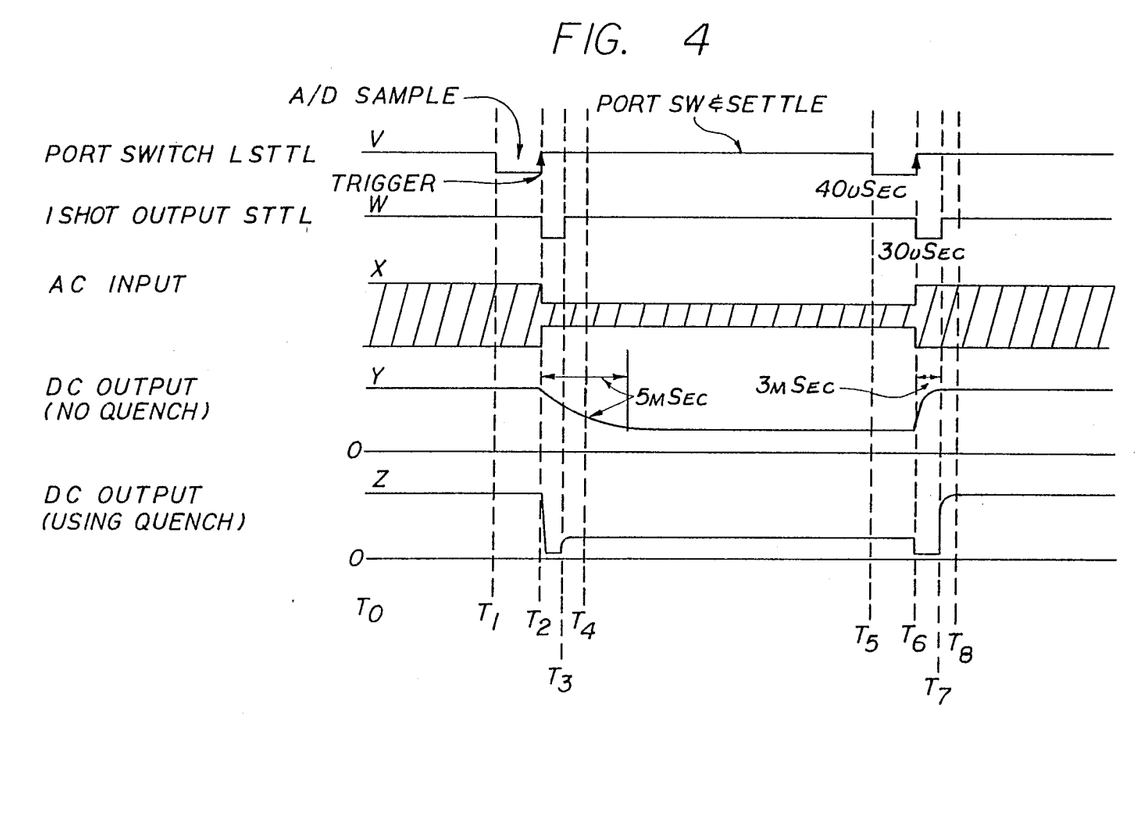
FIG. 4 is a timing diagram illustrating the effect of the quench subcircuit of the present invention.

The timing diagram of FIG. 4 illustrates the operation of the present invention. The AC input to the linear detector 80 is represented by the X waveform. The DC output of the linear detector 80 without the quench circuit 82 is shown by the Y waveform. Waveform Z represents the DC output of the integrator 100 and thus the linear detector 80 with the quench circuit 82. Waveform V represents the port switch output of the switch control circuit 52. Waveform W represents the output of the one shot 118, the quench control trigger signal.

During time period T0 to T1, the AC input signal is at some high level as represented by waveform X. Prior to time T1, the switch controller 52 had set the multiplexer 34 or 36 to measure the desired port. At the falling edge of V, time T1, the corresponding A/D converter 132-138 is enabled. The output of the detector 60 is digitized and stored in the associated memory for access by the controller 50 and at a later time by the computer 26.

When the port is switched such that the AC input to be measured is substantially lower than the previous level, the detector 60, without the quench circuit 82, begins to settle such that its output decays toward the new value as shown in waveform Y. Since the system must wait for the detector 60 to settle before taking the next measurement, this settling time adds to the time required to make each measurement. By way of illustration, using the values specified herein with regard to the illustrative embodiment, the settling time was approximately 5 msec.

However, when the quench circuit 82 of the present invention is used, the settling time may be cut substantially. Waveform W shows that the quench circuit 82 is triggered on the rising edge of the port switch signal at time T2. The quench circuit 82 momentarily discharges the capacitor 112 through the analog switch 114 to preclude the long time constant associated with the unmodified circuit. As shown in waveform Z, the detector is almost immediately reset allowing for a new measurement as early as T4, allowing a normal rise time from T3.

In the illustrative embodiment, the time period T2-T3 (T6-T7) was set to 30 microsec. to allow for the complete discharge of the capacitor 112. In applications requiring more speed, the 30 microsec. time period could be further reduced.

The switching procedure is reinitiated again at T5. The detector is reset once again at T6 allowing for a new measurement as early as T8.

While the present invention has been described herein with reference to a particular embodiment for an illustrative application, it is understood that the invention is not limited thereto. Those of ordinary skill in the art and access to the teachings of the present invention will recognize additional embodiments and applications within the scope thereof.

For example, the means for switching and downconverting the input signals can be changed without departing from the scope of the invention. Similarly, the means for digitizing and storing the output is not critical to the invention. Further, the integrator may be reset to any value including that of the illustrative embodiment without departing from the present invention. As mentioned above, the particular technique for detecting the AC signal to arrive at the DC signal is not critical and other techniques may be used without departing from the scope of the invention.

The present invention has utility outside of the illustrative application. For example, the present invention may be used in a number of automated applications that require that precision RF power measurements be made rapidly. Other applications of the present invention include radar systems and test equipment, transmit-receive signal strength indicators, network analyzers, spectrum analyzers, microwave/millimeter wave field strength meters and etc. when configured with suitable control and down conversion equipment.

It is intended by the appended claims to cover any and all such modifications, embodiments, and applications. Therefore,

What is claimed is:

1. A high speed wide range variable rate power detector for providing an output signal proportional to the power associated with an input signal comprising:
   first means for down converting the input signal to an intermediate frequency signal;
   second means for converting the intermediate frequency signal to a DC signal, said second means including:
   an integrator connected to said first means with a feedback capacitor and
   a linear detector including means for summing the log of the absolute value of the intermediate frequency signal with the log of a signal fed back from the output of said integrator;
   third means for varying the rate of conversion of said intermediate frequency signals to DC signals; and
   fourth means for providing said output signal as a function of the logarithm of said DC signal.

2. The power detector of claim 1 wherein said linear detector further includes means for providing the antilog of said summed signal as an input to said integrator.

* * * * *